United States Patent
Choe et al.

(10) Patent No.: US 6,881,621 B2
(45) Date of Patent: Apr. 19, 2005

(54) METHOD OF FABRICATING SOI SUBSTRATE HAVING AN ETCH STOP LAYER, AND METHOD OF FABRICATING SOI INTEGRATED CIRCUIT USING THE SAME

(75) Inventors: Tae-Hee Choe, Seoul (KR); Nae-In Lee, Seoul (KR); Geum-Jong Bae, Kyunggi-do (KR); Sang-Su Kim, Yongin-shi (KR); Hwa-Sung Rhee, Seoul (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 10/713,216

(22) Filed: Nov. 17, 2003

(65) Prior Publication Data

US 2004/0099910 A1 May 27, 2004

Related U.S. Application Data

(62) Division of application No. 09/989,112, filed on Nov. 21, 2001, now Pat. No. 6,670,677.

(30) Foreign Application Priority Data

May 22, 2001 (KR) .......................... 2001-28008

(51) Int. Cl.[7] ............................................... H01L 29/72
(52) U.S. Cl. .................... 438/251; 438/252; 438/435
(58) Field of Search ................................... 438/251, 252, 438/435; 257/355, 356

(56) References Cited

U.S. PATENT DOCUMENTS

| 5,374,564 | A | | 12/1994 | Bruel |
| 5,876,497 | A | * | 3/1999 | Atoji ........................ 438/521 |
| 2002/0197762 | A1 | | 12/2002 | Zosel et al. |

* cited by examiner

Primary Examiner—Edward Wojciechowicz
(74) Attorney, Agent, or Firm—Lee, Sterba & Morse, P.C.

(57) ABSTRACT

A method of fabricating a SOI substrate includes sequentially forming a first semiconductor layer, which may be either a porous semiconductor layer or a bubble layer, a second semiconductor layer and a buried oxide layer on a front surface of a semiconductor substrate, forming an etch stopping layer, which may be a silicon nitride layer, on a front surface of a supporting substrate; contacting the etch stopping layer with the buried oxide layer to bond the semiconductor substrate to the supporting substrate; and selectively removing the semiconductor substrate and the first semiconductor layer to expose the second semiconductor layer. The method may additionally include forming a buffer oxide layer between the supporting substrate and the etch stopping layer.

24 Claims, 8 Drawing Sheets

US 6,881,621 B2

METHOD OF FABRICATING SOI SUBSTRATE HAVING AN ETCH STOP LAYER, AND METHOD OF FABRICATING SOI INTEGRATED CIRCUIT USING THE SAME

This application is a DIVISION of application Ser. No. 09/989,112, filed Nov. 21, 2001, now U.S. Pat. No. 6,670,677.

BACKGROUND OF THE INVENTION

1. Field of the Invention

The present invention relates to a semiconductor device and to a method of fabricating the same. More particularly, the present invention relates to a silicon-on-insulator (SOI) integrated circuit having an electro-static discharge (ESD) circuit and to a method of fabricating the same.

2. Description of the Related Art

Generally, a semiconductor device includes an electrostatic discharge (ESD) circuit for protection. Thus, a semiconductor device can endure several thousand volts applied instantaneously from external sources. The ESD circuit has a function of protecting an internal circuit by bypassing static charges injected into each pad, through a power pad or a ground pad, in the event that a voltage deviating from the range of operating voltage is applied to each pad.

Problems with silicon substrates, which are widely used as substrates for semiconductor devices, however, can render forming an ESD circuit difficult for reasons that will follow.

First, forming shallow source/drain regions of a transistor is difficult making it not only difficult to realize highly integrated semiconductor devices, but also to decrease parasitic capacitance between the silicon substrate and the source/drain regions. Consequently, it is difficult to obtain improvements in the operation speed of semiconductor devices. Second, when forming a semiconductor memory device at a silicon substrate, it is difficult to decrease a soft error rate (SER) due to the cell-formed well. Third, when fabricating a semiconductor device having a CMOS circuit, it is difficult to suppress latch-up phenomenon.

Recently, in response to the above-mentioned problems associated with forming a semiconductor device at a silicon substrate, a technique of fabricating a semiconductor integrated circuit at a SOI substrate has been widely used. However, there are still limitations on the formation of an ESD circuit when fabricating a semiconductor device at a SOI substrate FIG. 1 illustrates an equivalent circuit design of a typical SOI integrated circuit having an ESD circuit.

Referring to FIG. 1, an input pad 50 is connected with an internal circuit 100 through an ESD circuit 1. The ESD circuit 1 includes a diode D. The ESD circuit 1 may also include a MOS transistor. A n-type region and a p-type region of the diode are connected with the input pad 50 and a ground terminal, respectively. Also, the input pad 50 is connected with an input terminal of the internal circuit 100. The input terminal of the internal circuit 100 corresponds to a gate electrode of the MOS transistor composing a CMOS circuit. Although an inverter including both a PMOS transistor Tp and an NMOS transistor Tn is given here as an example of the internal circuit, the internal circuit may be a circuit including a NAND gate, a NOR gate or a combination thereof.

Reverse bias breakdown voltage of the diode D should be higher than the operating voltage of the internal circuit 100, that is, power voltage. Also, reverse bias breakdown voltage of the diode D should be lower than the gate oxide layer breakdown voltage of both the PMOS transistor Tp and the NMOS transistor Tn composing the internal circuit 100.

When applying voltage higher than the reverse bias breakdown voltage of the diode D to the input pad 50, a large current is by-passed to the ground terminal through the diode D. Thus, although a high voltage of several thousand volts is applied to the input pad 50, a voltage, which is applied to the input terminal of the internal circuit, is higher than the power voltage and lower than the gate oxide layer breakdown voltage. Thus, the internal circuit 100 is protected by the ESD circuit 1.

FIGS. 2 through 4 illustrate cross-sectional views of a conventional fabrication method for realizing the SOI integrated circuit shown in FIG. 1.

Referring to FIG. 2, a SOI substrate is prepared. The SOI substrate includes a supporting substrate 11, a buried oxide layer 13 stacked on the supporting substrate 11 and a semiconductor layer 15 stacked on the buried oxide layer 13. A device isolation layer 15a is selectively formed at a predetermined region of the semiconductor layer 15. The device isolation layer 15a is formed to contact with the buried oxide layer 13. Thus, active regions 15b surrounded by the device isolation layer 15a and the buried oxide layer 13 are defined. A photoresist pattern 17 is formed on the resultant structure where the device isolation layer 15a is formed. The photoresist pattern 17 has a first opening 17a and a second opening 17b exposing predetermined regions of the ESD circuit region 1.

Referring to FIG. 3, the device isolation layer 15a and the buried oxide layer 13 are continuously dry-etched using the photoresist pattern 17 of FIG. 2 as an etch mask, to form holes exposing predetermined regions of the supporting substrate 11. At this time, the exposed supporting substrate 11 has a damaged surface 21 resulting from the dry-etch. Epitaxial layers are selectively formed on the damaged surface 21. Thus, because a property of the semiconductor epitaxial layers is that they are directly affected by the underlying layer, first and second semiconductor epitaxial layers 19a and 19b have crystalline defects.

Referring to FIG. 4, the NMOS transistor Tn and the PMOS transistor Tp of FIG. 1 are formed at the active regions 15b in the internal circuit region 100 using a conventional method. The NMOS transistor includes both a gate oxide layer 21 and a first gate electrode 23n sequentially stacked on a predetermined region of the active region 15b. Further, the NMOS transistor includes a first source region 27s and a first drain region 27d formed at both sides of the first gate electrode 23n, respectively. Likewise, the PMOS transistor includes a gate oxide layer 21 and a second gate electrode 23p sequentially stacked on a predetermined region of the active region adjacent to the NMOS transistor. The PMOS transistor also includes a second source region 29s and a second drain region 29d formed at both sides of the second gate electrode 23p, respectively.

Further, spacers 25 are formed on sidewalls of the first and second gate electrodes 23n and 23p. Also, metal silicide layers 31 may be formed on the first and second gate electrodes 23n and 23p, and the first and second source/drain regions 27s, 27d, 29s and 29d, through a self-aligned silicide (salicide) process.

Meanwhile, a p-type impurity layer 29p and an n-type impurity layer 27p are formed in the first and second semiconductor epitaxial layers 19a and 19b of FIG. 3, respectively. The n-type impurity layer 27p may be formed simultaneously with the first source/drain regions 27s and 27d, and the p-type impurity layer 29p may be formed simultaneously with the second source/drain region 29s and 29d. Also, the metal silicide layers 31 may be formed even at the surfaces of the n-type and p-type impurity layers 27p and 29p. The n-type and p-type impurity layers 27p and 29p correspond to the n-type and p-type regions of the diode D illustrated in FIG. 1, respectively. Consequently, a junction of the diode D exists in the semiconductor epitaxial layers 19a and 19b, and thus, the diode shows a very inferior leakage current characteristic.

According to the conventional technology as described above, the leakage current characteristic of the diode used as the ESD circuit becomes remarkably lowered. Thus, the ESD characteristic of the SOI integrated circuit is degraded.

SUMMARY OF THE INVENTION

It is therefore a feature of an embodiment of the present invention to provide a SOI substrate having an etch stopping layer interposed between a buried oxide layer and a supporting substrate.

It is another feature of an embodiment of the present invention to provide a SOI integrated circuit having an improved ESD characteristic by forming an ESD diode without crystalline defects at a SOI substrate having an etch stopping layer that is interposed between a buried oxide layer and a supporting substrate.

It is still another feature of an embodiment of the present invention to provide a method of fabricating a SOI substrate having an etch stopping layer interposed between a buried oxide layer and a supporting substrate.

Further, it is another feature of an embodiment of the present invention to provide a method of fabricating a SOI integrated circuit that can improve an ESD characteristic using a SOI substrate having an etch stopping layer interposed between a buried oxide layer and a supporting substrate.

A feature of an embodiment of the present invention may be addressed by a SOI integrated circuit according to the present invention. The SOI substrate includes an etch stopping layer, a buried oxide layer and a semiconductor layer sequentially formed on a front surface of a supporting substrate.

Preferably, the supporting substrate is a single crystalline semiconductor substrate such as a single crystalline silicon substrate. Also, it is preferable that the etch stopping layer is an insulation layer having an etch selectivity with respect to the buried oxide layer, i.e., a silicon nitride layer. The SOI substrate may further comprise a buffer oxide layer interposed between the supporting substrate and the etch stopping layer.

Another feature of an embodiment of the present invention may be addressed by a SOI integrated circuit in accordance with the present invention. The SOI integrated circuit includes a SOI substrate. The SOI substrate includes a supporting substrate of a first conductivity type, an etch stopping layer stacked on the supporting substrate, a buried oxide layer stacked on the etch stopping layer, and a semiconductor layer stacked on the buried oxide layer. Device isolation layers are preferably formed at predetermined regions of the semiconductor layer to define first and second active regions. The supporting substrate preferably contacts with first and second semiconductor epitaxial layers that pierce the device isolation layer, the buried oxide layer and the etch stopping layer. A pick-up region of the first conductivity type and another pick-up region of the second conductivity type are preferably disposed at surfaces of the first and second semiconductor epitaxial layers, respectively. The first and second conductivity types may correspond to a p-type and an n-type, respectively, or vice versa. NMOS and PMOS transistors are preferably formed at the first and second active regions, respectively. Here, the pick-up regions and the supporting substrate compose the diode of the ESD circuit.

The pick-up regions, the device isolation layer, the NMOS and PMOS transistors are preferably covered with an interlayer insulation layer. First and second interconnections and an input pad may be disposed on the interlayer insulation layer. In the event that the first and second conductivity types are p-type and n-type, respectively, the first interconnection is electrically connected with the pick-up region of the first conductivity type and the second interconnection is electrically connected with the pick-up region of the second conductivity type and the input pad. Further, the second interconnection is connected with the input terminal of a CMOS internal circuit including the NMOS transistor and the PMOS transistor.

A buffer oxide layer may also be interposed between the supporting substrate of the first conductivity type and the etch stopping layer. In this case, the first and second semiconductor epitaxial layers pierce the buffer oxide layer.

Another feature by an embodiment of the present invention may be addressed by a method of fabricating a SOI substrate in accordance with the present invention. The method includes forming first and second semiconductor layers and a buried oxide layer in sequence on a front surface of a semiconductor substrate, and forming an etch stopping layer on a front surface of a supporting substrate. It is preferable that the supporting substrate is a single crystalline semiconductor substrate such as a single crystalline silicon substrate. The etch stopping layer and the buried oxide layer are contacted with each other to bond the semiconductor substrate to the supporting substrate. The semiconductor substrate and the first semiconductor layer are selectively removed to expose the second semiconductor layer.

Preferably, the first semiconductor layer is a porous semiconductor epitaxial layer. Alternatively, the first semiconductor layer may be formed of a bubble layer. Also, the etch stopping layer is preferably formed of an insulation layer such as a silicon nitride layer having an etch selectivity with respect to a silicon oxide layer.

Yet another feature of an embodiment of the present invention may be addressed by a method of fabricating a SOI integrated circuit in accordance with the present invention. The method includes providing a SOI substrate having a supporting substrate of a first conductivity type, an etch stopping layer stacked on the supporting substrate, a buried oxide layer stacked on the etch stopping layer, and a semiconductor layer stacked on the buried oxide layer. A device isolation layer is formed at a predetermined region of the semiconductor layer to define first and second active regions. The device isolation layer and the buried oxide layer are continuously dry-etched to form first and second preliminary holes exposing the etch stopping layer. The etch stopping layer exposed by the first and second preliminary holes is wet-etched to form first and second holes exposing the supporting substrate. Thus, etch damage applied to the surface of the exposed supporting substrate may be minimized. First and second semiconductor epitaxial layers are grown in the first and second holes, respectively. At this time, growth rates and properties of the first and second semiconductor epitaxial layers are directly affected by the surface state of the exposed supporting substrate. Consequently, in the event that the supporting substrate is a single crystalline semiconductor substrate and there is no etch damage on the surface of the supporting substrate, the first and second semiconductor epitaxial layers also do not have a crystalline defect but a single crystalline structure.

A pick-up region of a first conductivity type and another pick-up region of a second conductivity type are formed at surfaces of the first and second semiconductor epitaxial layers, respectively. Also, NMOS and PMOS transistors are formed at the first and second active regions, respectively. In the event that the first and second conductivity types are p-type and n-type, respectively, the pick-up region of the first conductivity type is preferably formed simultaneously with the source/drain regions of the PMOS transistor, and the pick-up region of the second conductivity type is preferably formed simultaneously with the source/drain regions of the NMOS transistor. On the other hand, in the event that the first and second conductivity types are n-type and p-type, respectively, the pick-up region of the first conductivity type is preferably formed simultaneously with the source/drain regions of the NMOS transistor, and the pick-up region of the second conductivity type is preferably formed simultaneously with the source/drain regions of the PMOS transistor.

Another feature of an embodiment of the present invention may be addressed by a method of fabricating a SOI integrated circuit according to the present invention. The method includes providing a SOI substrate including a supporting substrate of a first conductivity type, an etch stopping layer stacked on the supporting substrate, a buried oxide layer stacked on the etch stopping layer, and a semiconductor layer stacked on the buried oxide layer. A device isolation layer is formed at a predetermined region of the semiconductor layer to define first and second active regions. Then, the device isolation layer and the buried oxide layer are continuously dry-etched to form first and second preliminary holes exposing the etch stopping layer. A pick-up region of a first conductivity type is formed at the supporting substrate below the etch stopping layer exposed by the first preliminary hole. A pick-up region of a second conductivity type is formed at the supporting substrate below the etch stopping layer exposed by the second preliminary hole. Also, NMOS and PMOS transistors are formed at the first and second active regions, respectively.

The pick-up region of the first conductivity type is preferably formed by implanting impurity ions of the first conductivity type into the support substrate using the etch stopping layer as a screen material layer. Likewise, the pick-up region of the second conductivity type is preferably formed by implanting impurity ions of the second conductivity type into the support substrate using the etch stopping layer as a screen material layer.

These and other features and aspects of the present invention will be readily apparent to those of ordinary skill in the art upon review of the detailed description that follows.

DETAILED DESCRIPTION OF THE PREFFERED EMBODIMENTS

Korean Patent Application No. 2001-28008, filed on May 22, 2001, and entitled: "SOI Substrate having an Etch Stop Layer, and Fabrication Method Thereof, SOI integrated Circuit Fabricated Thereon, and Method of Fabricating SOI Integrated Circuit Using the Same," is incorporated herein by reference in its entirety.

The present invention will be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the attached figures, the thickness of layers and regions is exaggerated for clarity. Also, when it is mentioned that a layer is on another layer or on a substrate, the layer may be directly formed on another layer or on a substrate, or a third layer may be interposed therebetween. Like reference numbers indicate like components throughout the specification.

FIGS. 5 through 13 illustrate cross-sectional views of methods of fabricating a SOI substrate and a SOI integrated circuit in accordance with a first preferred embodiment of the present invention. In all figures, parts indicated by the reference numbers "1" and "100" correspond to an ESD circuit region and an internal circuit region, respectively.

Figure 5:
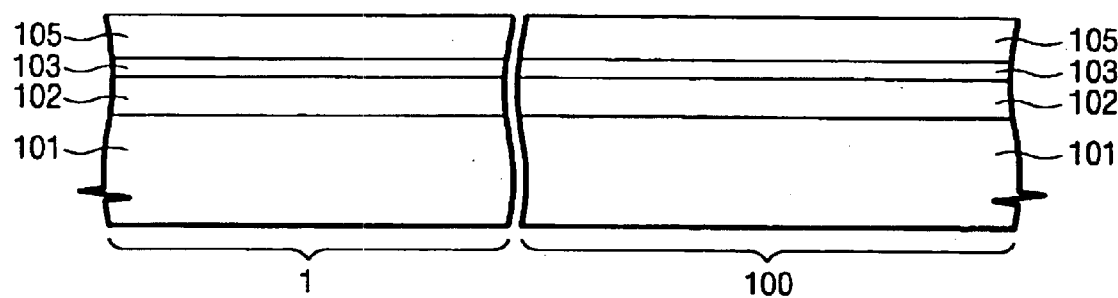
FIGS. 5 through 13 illustrate cross-sectional views of both a method of fabricating a SOI integrated circuit in accordance with one preferred embodiment of the present invention and the SOI integrated circuit fabricated by the method.

Referring to FIG. 5, a first semiconductor layer 102, a second semiconductor layer 103 and a buried oxide layer 105 are sequentially formed on a front surface of a semiconductor substrate 101 such as a single crystalline silicon substrate. Here, the second semiconductor layer 103 is preferably defined by implanting hydrogen ions into a bulk region of the semiconductor substrate 101 to form the first semiconductor layer 102 composed of a bubble layer at a predetermined depth from the top surface of the semiconductor substrate 101. The method of forming the first and second semiconductor layers 102 and 103 is concretely disclosed in the U.S. Pat. No. 5,374,564 to Michel Bruel, entitled "Process for the production of thin semiconductor material films," and is omitted here for simplicity.

Alternatively, the first semiconductor layer 102 may be formed of a porous semiconductor layer. The porous semiconductor layer is formed by anodizing the semiconductor substrate 101. Also, the second semiconductor layer 103 is formed on the porous semiconductor layer using an epitaxial method. At this time, the second semiconductor layer 103 preferably has a higher density than the porous semiconductor layer. The method of forming the porous semiconductor layer and the dense semiconductor epitaxial layer is concretely disclosed in the U.S. Pat. No. 5,876,497 to Tadashi Atoji, entitled "Fabrication process and fabrication apparatus of SOI substrate," and is omitted here for simplicity.

The buried oxide layer 105 is formed of a thermal oxide layer or a chemical vapor deposition (CVD) oxide layer. It is desired that the buried oxide layer 105 is formed to a thickness of 1,000 Å to 5,000 Å.

Figure 6:
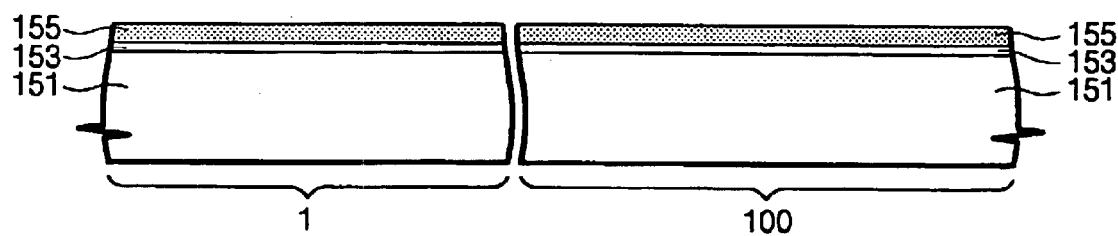

Referring to FIG. 6, an etch stopping layer 155 is formed on a front surface of a supporting substrate 151 of a first conductivity type. Here, the first conductivity type corresponds to a p-type. But, the first conductivity type may be an n-type. The etch stopping layer 155 is preferably formed of an insulation layer such as a silicon nitride layer having an etch selectivity with respect to a silicon oxide layer. A buffer oxide layer 153 may be formed on the supporting substrate 151 prior to formation of the etch stopping layer 155. The buffer oxide layer 153 alleviates stress resulting from the difference of the thermal expansion coefficients between the supporting substrate 151 and the etch stopping layer 155. The etch stopping layer 155 and the buffer oxide layer 153 are preferably formed to a relatively thin thickness in comparison with the buried oxide layer 105. For example, the etch stopping layer 155 is preferably formed to a thickness of 100 Å to 300 Å, and the buffer oxide layer 153 is preferably formed to a thickness of 50 Å to 200 Å.

Figure 7:
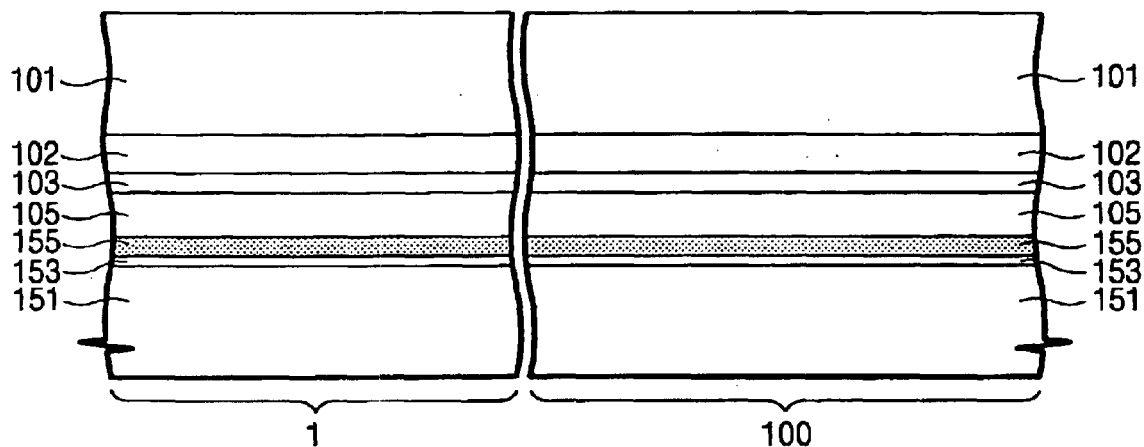

Referring to FIG. 7, a top surface of the buried oxide layer 105 is contacted with a top surface of the etch stopping layer 155 to bond the semiconductor substrate 101 to the supporting substrate 151.

Figure 8:
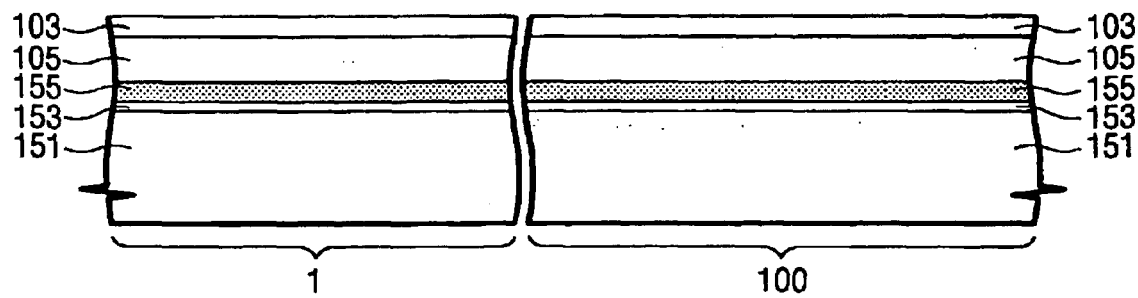

Referring to FIG. 8, the semiconductor substrate 101 and the first semiconductor layer 102 of FIG. 7 are selectively removed to expose the second semiconductor layer 103. A method of selectively removing the semiconductor substrate 101 and the first semiconductor layer 102 is concretely disclosed in the U.S. Pat. No. 5,876,497, and thus, the explanation about the method is omitted for simplicity.

Here, the supporting substrate 151, the buffer oxide layer 153, the etch stopping layer 155, the buried oxide layer 105 and the second semiconductor layer 103 compose the SOI substrate in accordance with a preferred embodiment of the present invention.

Figure 9:
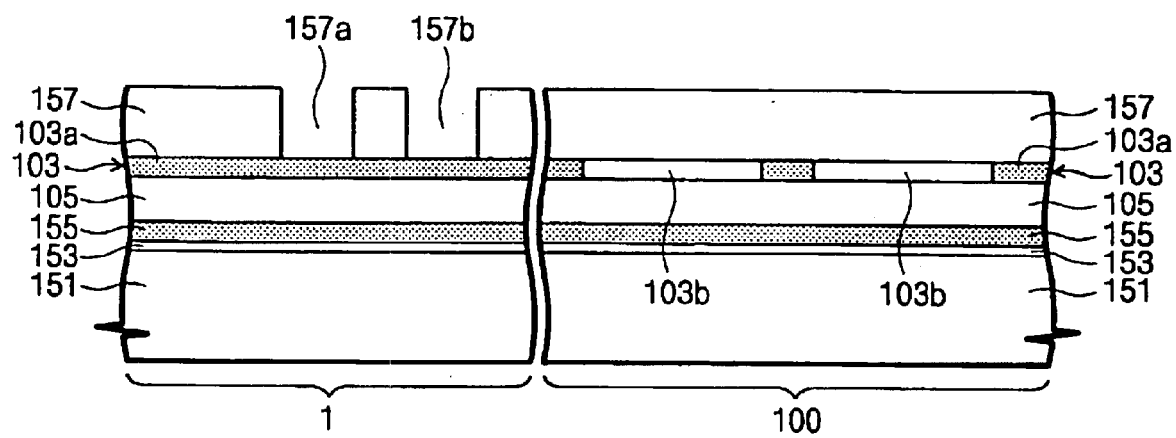

Referring to FIG. 9, a device isolation layer 103a is formed at a predetermined region of the second semiconductor layer 103 to define multiple active regions 103b such as the first and second active regions in the internal circuit region 100. The device isolation layer 103a contacts with the top surface of the buried oxide layer 105. Thus, sidewalls and bottom surfaces of the first and second active regions 103b are surrounded by the device isolation layer 103a and the buried oxide layer 105. Then, a photoresist pattern 157 having first and second openings 157a and 157b is formed on the semiconductor substrate having the device isolation layer 103a. The first and second openings 157a and 157b expose predetermined regions of the device isolation layer 103a in the ESD circuit region 1.

Figure 10:
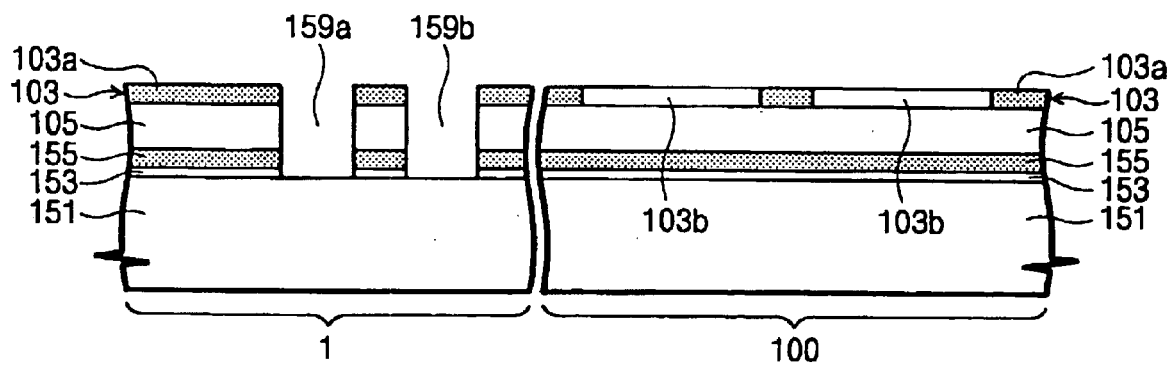

Referring to FIG. 10, the device isolation layer 103a and the buried oxide layer 105 are etched using the photoresist pattern 157 as an etch mask to expose predetermined regions of the etch stopping layer 155. At this time, it is desired that the device isolation layer 103a and the buried oxide layer 105 are anisotropically etched using a dry-etch process. Continuously, the exposed etch stopping layer 155 and the underlying buffer oxide layer 153 are wet-etched to form first and second holes 159a and 159b exposing predetermined regions of the supporting substrate 151. Thus, it is possible to prevent the surface of the supporting substrate 151 exposed by the first and second holes 159a and 159b from being etch-damaged. Consequently, the exposed surface of the supporting substrate 151 still has a single crystalline structure. Then, the photoresist pattern 157 is removed.

Figure 11:
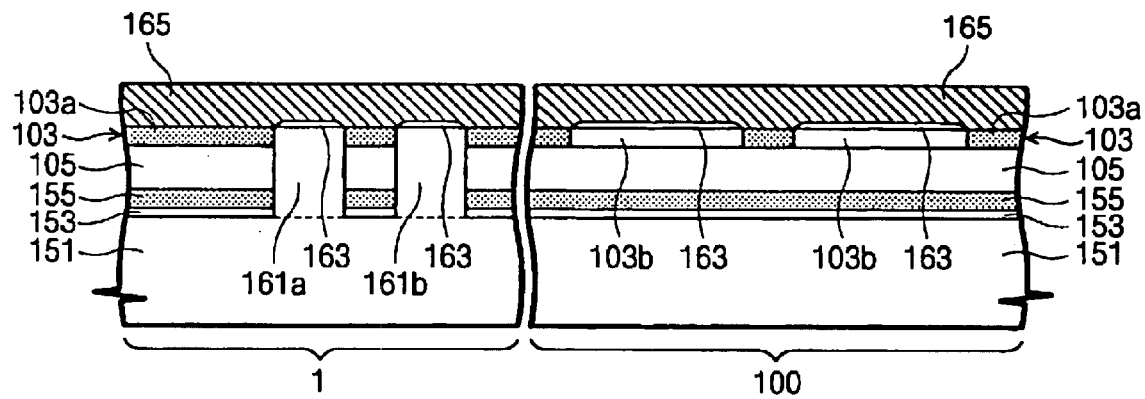

Referring to FIG. 11, first and second semiconductor epitaxial layers 161a and 161b are grown in the first and second holes 159a and 159b of FIG. 10 using a conventional selective epitaxial growth process. Here, in the event that the supporting substrate 151 is a single crystalline silicon substrate, the first and second semiconductor epitaxial layers correspond to silicon epitaxial layers having single crystalline structures. Particularly, in the event that there is no crystalline defect at the surface of the exposed supporting substrate 151, the first and second semiconductor epitaxial layers 161a and 161b also have single crystalline structures without crystalline defects. The semiconductor substrate having the first and second semiconductor epitaxial layers 161a and 161b is thermal-oxidized to form a gate insulation layer 163 on the surface of the first and second active regions 103b. At this time, the gate insulation layer 163 is also formed on the surfaces of the first and second semiconductor epitaxial layers 161a and 161b. A conductive layer 165 is formed on the entire surface of the semiconductor substrate including the gate insulation layer 163. The conductive layer 165 is preferably formed of a doped polysilicon layer.

Figure 12:
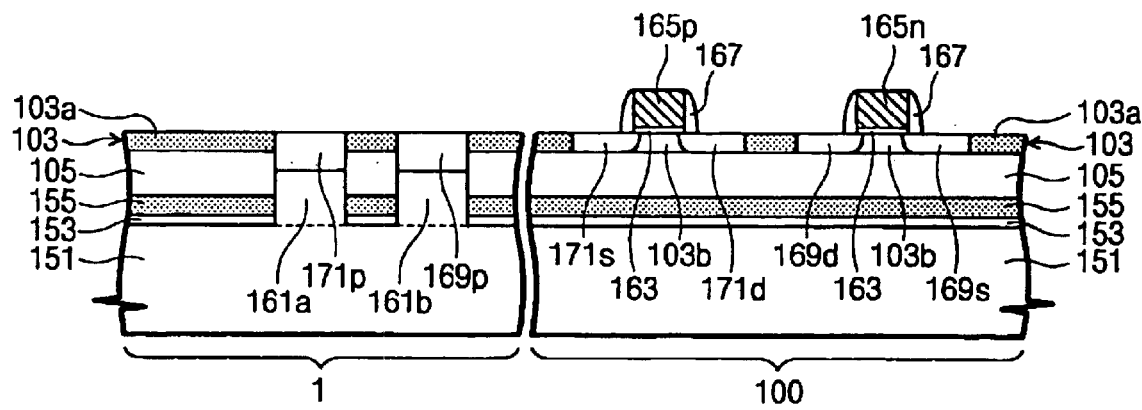

Referring to FIG. 12, the conductive layer 165 is patterned to form both a first gate electrode 165p crossing over the first active region 103b and a second gate electrode 165n crossing over the second active region 103b. Then, spacers 167 are formed on the sidewalls of the first and second gate electrodes 165p and 165n, using the conventional method. Also, impurities of a second conductivity type are selectively implanted into the second active region 103b and the second semiconductor epitaxial layer 161b, using the second gate electrode 165n and spacers 167 as ion-implantation masks. Consequently, source/drain regions 169s and 169d of the second conductivity type are formed at the second active region 103b, and at the same time, a pick-up region 169p of the second conductivity type is formed at the second semiconductor epitaxial layer 161b. Likewise, impurities of the first conductivity type are selectively implanted into the first active region 103b and the first semiconductor epitaxial layer 161a, using the first gate electrode 165p and the spacers 167 as ion-implantation masks. Consequently, source/drain regions 171s and 171d of the first conductivity type are formed at the first active region 103b, and at the same time, another pick-up region 171p of the first conductivity type is formed at the first semiconductor epitaxial layer 161a.

Figure 1:
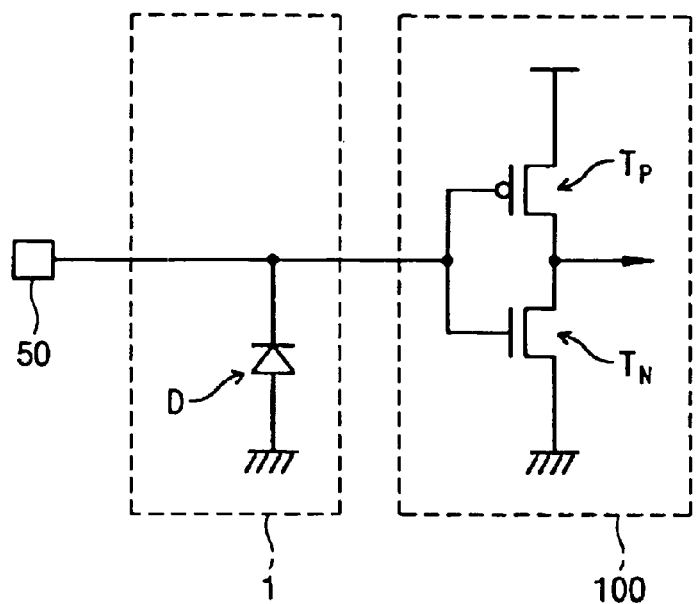
FIG. 1 illustrates a partial equivalent circuit diagram of a typical SOI integrated circuit having an ESD circuit.
Figure 2:
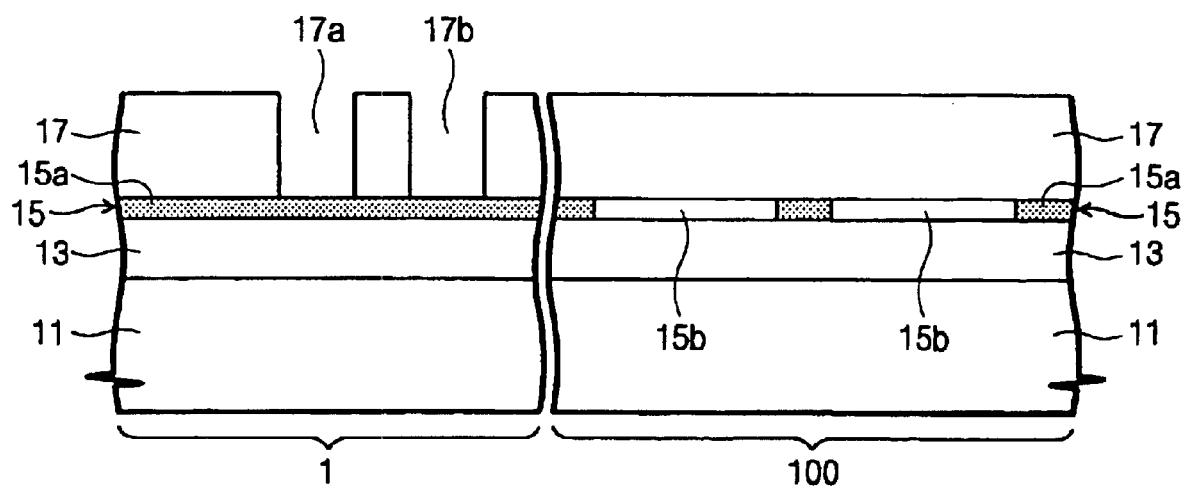
FIGS. 2 through 4 illustrate cross-sectional views of a method of fabricating a SOI integrated circuit in accordance with a conventional technology.
Figure 3:
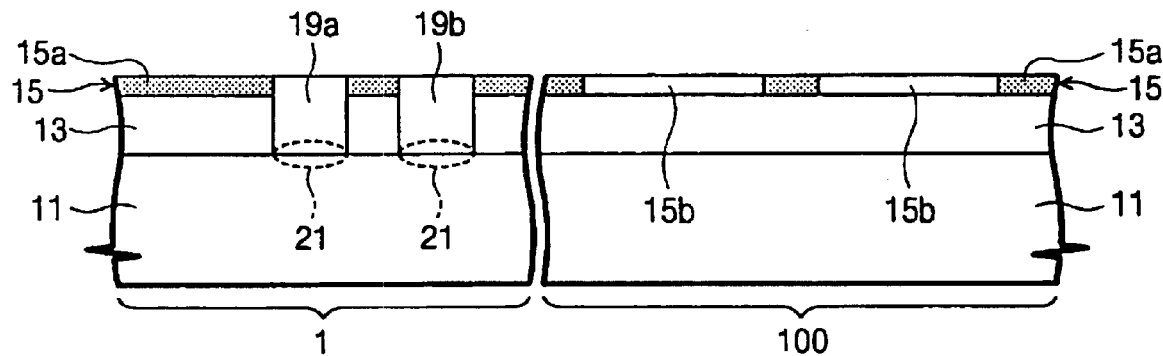
Figure 4:
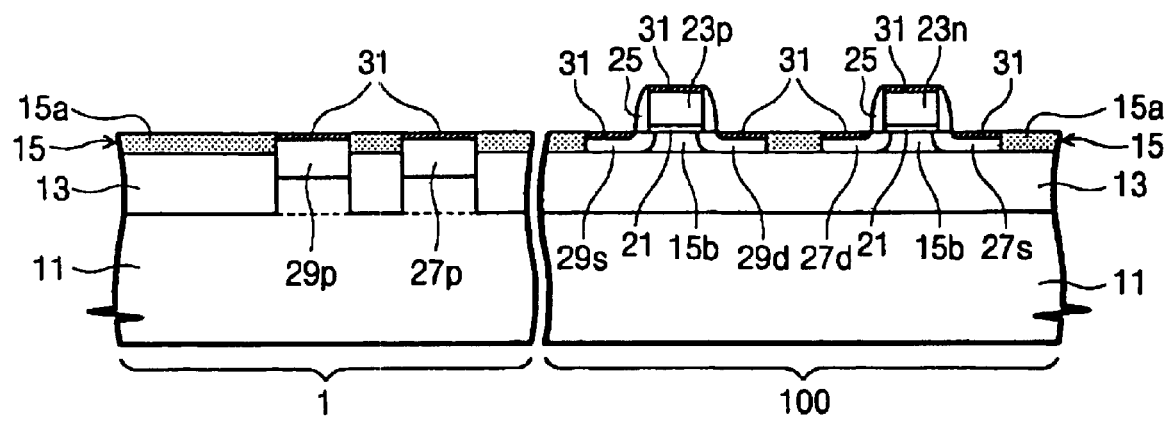

When the first conductivity type is p-type, the second conductivity type corresponds to n-type. On the contrary, when the first conductivity type is n-type, the second conductivity type is p-type. Consequently, in the event that the first and second conductivity types are p-type and n-type, respectively, the PMOS transistor Tp and the NMOS transistor Tn of FIG. 1 are formed at the first and second active regions, and p-type and n-type pick-up regions are formed at the first and second semiconductor epitaxial layers 161a and 161b. Thus, a PN diode D of FIG. 1 is formed in the ESD circuit region 1. The diode is formed at the first and second semiconductor epitaxial layers 161a and 161b without crystalline defects, and thus, has a superior leakage current characteristic in comparison with the conventional technology.

Figure 13:
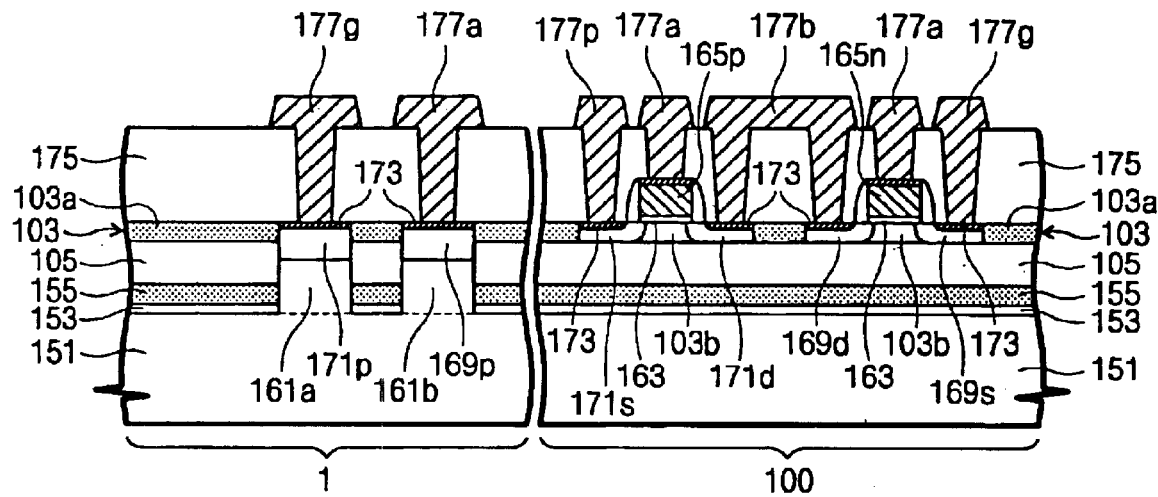

Referring to FIG. 13, an interlayer insulation layer 175 is formed on the entire surface of the resultant structure where the diode, the NMOS transistor and the PMOS transistor are formed. Before forming the interlayer insulation layer 175, a metal silicide layer 173 may be formed on the pick-up regions 171p and 169p, the first gate electrode 165p, the second gate electrode 165n, and the source/drain regions 169s, 169d, 171s and 171d, using the conventional salicide process.

The interlayer insulation layer 175 is patterned to form contact holes exposing the metal silicide layer 173. Then, first through fourth interconnections 177g, 177a, 177b, and 177p are formed to cover the contact holes. The first interconnection 177g is electrically connected with the first conductivity type pick-up region 171p and the source region 169s of the NMOS transistor, and the second interconnection 177a is electrically connected with the second conductivity type pick-up region 169p, the first gate electrode 165p and the second gate electrode 165n. Also, the third interconnection 177b is electrically connected with the drain region 169d of the NMOS transistor and the drain region 171d of the PMOS transistor, and the fourth interconnection 177p is electrically connected with the source region 171s of the PMOS transistor.

In the event that the first and second conductivity types are p-type and n-type, respectively, the first interconnection 177g is connected with a ground line of FIG. 1 and the second interconnection 177a is connected with an input pad 50 of FIG. 1. Further, the fourth interconnection 177p is connected with a power line not shown.

Consequently, since the diode formed at the ESD circuit region 1 has no crystalline defect, the diode shows a superior junction leakage current characteristic. Therefore, although static charges due to high voltages of several thousand volts are instantly injected into the input pad, the static charges are bypassed to the ground line through the reverse bias current of the diode. Thus, the CMOS circuit in the internal circuit region 100 is protected.

Figure 14:
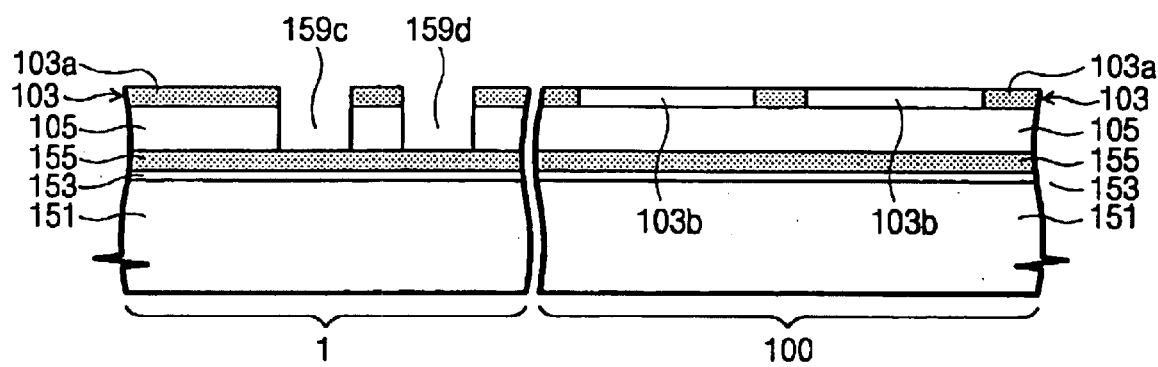
FIGS. 14 through 16 illustrate cross-sectional views of both a method of fabricating a SOI integrated circuit in accordance with another preferred embodiment of the present invention and the SOI integrated circuit fabricated by the method.
Figure 15:
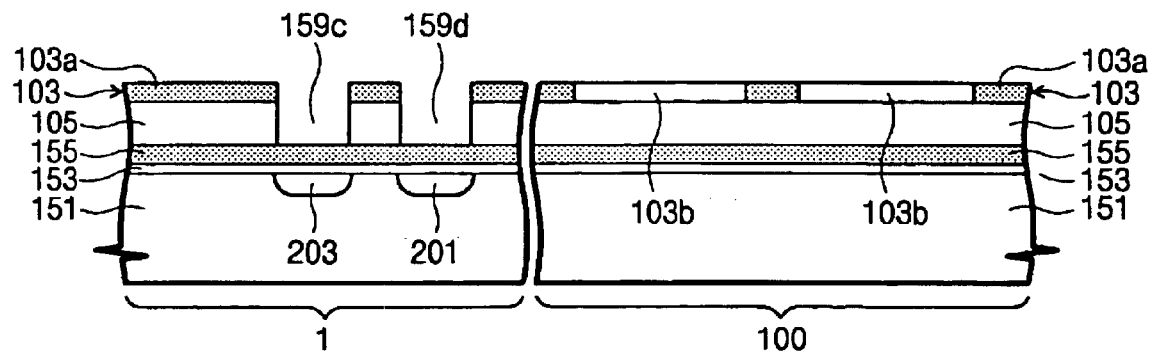
Figure 16:
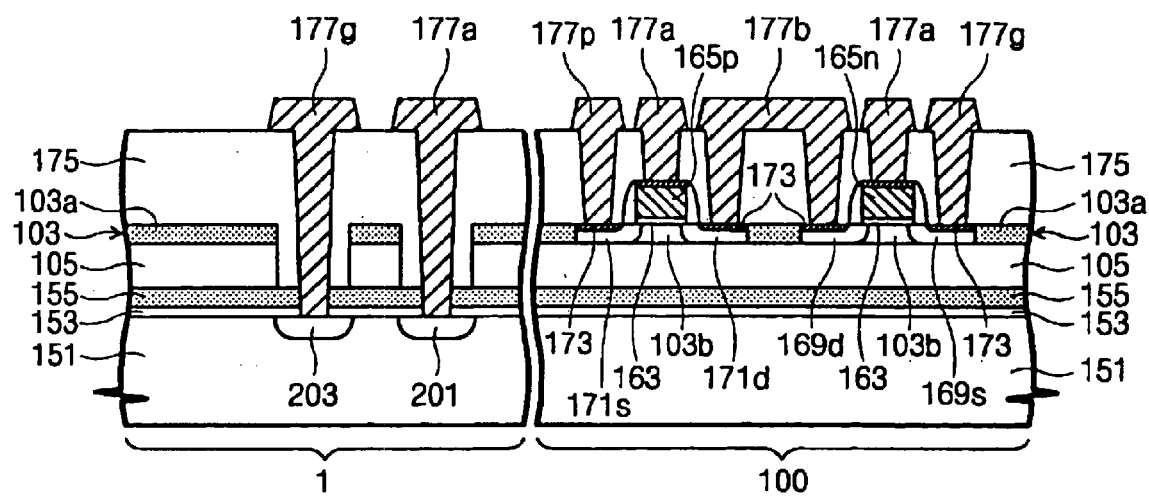

FIGS. 14 through 16 illustrate cross-sectional views of a method of fabricating a SOI integrated circuit in accordance with another preferred embodiment of the present invention.

Referring to FIG. 14, a SOI substrate having etch stopping layer 155 is formed using a same method as the first preferred embodiment of the present invention. Also, device isolation layer 103a is formed at a predetermined region of the semiconductor layer 103 of the SOI substrate using a same method as the first preferred embodiment of the present invention. Thus, first and second active regions are defined in internal circuit region 100. The device isolation layer 103a and buried oxide layer 105 are continuously anisotropically etched to form first and second preliminary holes 159c and 159d exposing predetermined regions of the etch stopping layer 155 in ESD circuit region 1.

Referring to FIG. 15, first conductivity type impurity ions are implanted into the supporting substrate 151 under the first preliminary hole 159c, to form a first conductivity type pick-up region 203. Also, second conductivity type impurity ions are implanted into the supporting substrate 151 of the second preliminary hole 159d, to form a second conductivity type pick-up region 201. Here, the first and second conductivity types may correspond to p-type and n-type, respectively. On the contrary, the first and second conductivity types may correspond to n-type and p-type, respectively. Thus, the PN diode D of FIG. 1 is formed at the supporting substrate 151 in the ESD circuit region 1. Etch stopping layer 155 and buffer oxide layer 153, which exist on the supporting substrate 151, may eliminate etch-damage on the surface of the supporting substrate 151 even though the first and second preliminary holes 159c and 159d are formed using a dry-etch process. Consequently, the diode has a junction without crystalline defects.

Referring to FIG. 16, PMOS and NMOS transistors are formed at the first and second active regions 103b using a same method as the first preferred embodiment of the present invention. Further, the metal silicide layer 173 may be selectively formed on the gate electrode 165n and source/drain regions 169s and 169d of the NMOS transistor, and on the gate electrode 165p and source/drain regions 171s and 171d of the PMOS transistor. Interlayer insulation layer 175 is formed on the entire surface of the semiconductor substrate including the NMOS and PMOS transistors.

Continuously, first through fourth interconnections 177g, 177a, 177b and 177p are formed on the interlayer insulation layer 175 using the same method as the first preferred embodiment of the present invention. Here, the first interconnection 177g is electrically connected with the first conductivity type pick-up region 203 and the source region 169s of the NMOS transistor, and the second interconnection 177a is electrically connected with the second conductivity type pick-up region 201, the first gate electrode 165p and the second gate electrode 165n.

Next, referring again to FIG. 8, the SOI substrate in accordance with the present invention will be explained.

Referring to FIG. 8, the etch stopping layer 155 is stacked on the supporting substrate 151 of the first conductivity type, which may be p-type or n-type. A top surface of the etch stopping layer 155 is covered with the buried oxide layer 105, and a top surface of the buried oxide layer 105 is covered with the semiconductor layer 103. The buffer oxide layer 153 may be interposed between the etch stopping layer 155 and the supporting substrate 151. It is preferable that the etch stopping layer 155 is an insulation layer such as a silicon nitride layer having an etch selectivity with respect to the buried oxide layer 105. The buffer oxide layer 153 prevents stress due to application of the etch stopping layer to the supporting substrate 151. The supporting substrate 151 includes a single crystalline silicon substrate.

Referring again to FIGS. 13 and 16, the SOI integrated circuits in accordance with the first and second preferred embodiments of the present invention will be explained.

Referring to FIG. 13, the device isolation layer 103a is disposed at a predetermined region of the semiconductor layer 103 of the SOI substrate illustrated in FIG. 8. The device isolation layer 103a defines the first and second active regions 103b in the internal circuit region 100. The first and second semiconductor epitaxial layers 161a and 161b are located in the first and second holes piercing the device isolation layer 103a, the buried oxide layer 105, the etch stopping layer 155 and the buffer oxide layer 153. The first and second semiconductor epitaxial layers 161a and 161b contact with the supporting substrate 151. The first conductivity type pick-up region 171p is formed at the surface of the first semiconductor epitaxial layer 161a, and the second conductivity type pick-up region 169p is formed at the surface of the second semiconductor epitaxial layer 161b. Consequently, the PN diode is formed in the ESD circuit region 1.

Also, the PMOS transistor is formed at the first active region 103b, and the NMOS transistor is formed in the second active region 103b. The PMOS transistor includes the first gate electrode 165p and p-type source/drain regions 171s and 171d, and the NMOS transistor includes the second gate electrode 165n and n-type source/drain regions 169s and 169d. The metal silicide layer 173 may also be formed on the surfaces of the first and second gate electrodes 165p and 165n, the p-type source/drain regions 171s and 171d, the n-type source/drain regions 169s and 169d, and the first and second conductivity type pick-up regions 171p and 169p.

The semiconductor substrate including the first and second conductivity type pick-up regions 171p and 169p, and the PMOS and NMOS transistors is covered with the interlayer insulation layer 175. The first through fourth interconnections 177g, 177a, 177b and 177p are arranged on the interlayer insulation layer 175.

In the event that the first and second conductivity types are p-type and n-type, respectively, the first interconnection 177g is electrically connected with the first conductivity type, pick-up region 171p, the n-type source region 169s and the ground line of FIG. 1, and the second interconnection 177a is electrically connected with the second conductivity type pick-up region 169p, the first gate electrode 165p, the second gate electrode 165n and the input pad 50 of FIG. 1. Further, the third interconnection 177b is electrically connected with the p-type drain region 171d and the n-type drain region 169d, and the fourth interconnection 177p is electrically connected with the p-type source region 171s and the power line not shown.

FIG. 16 illustrates a cross-sectional view of the SOI integrated circuit in accordance with the second preferred embodiment of the present invention. The internal circuit region 100 of the SOI integrated circuit in accordance with the second preferred embodiment has the same structure as that in accordance with the first preferred embodiment of the present invention. Thus, explanation about the internal circuit region 100 is omitted.

Referring to FIG. 16, the first and second preliminary holes are positioned to pierce the device isolation layer 103a and the buried oxide layer 105 in the ESD circuit region 1. The first conductivity type pick-up region 203 is formed at the surface of the supporting substrate 151 under the first preliminary hole. Also, the second conductivity type pick-up region 201 is formed at the surface of the supporting substrate under the second preliminary hole. Thus, the PN diode D of FIG. 1 is formed at the supporting substrate 151 in the ESD circuit region 1. The entire surface of the semiconductor substrate having the PN diode is covered with the interlayer insulation layer 175 filling the first and second preliminary holes. The first through fourth interconnections 177g, 177a, 177b and 177p are arranged on the interlayer insulation layer 175 as in the first preferred embodiment of the present invention as explained in the FIG. 13.

In the event that the first and second conductivity types are p-type and n-type, respectively, the first interconnection 177g is electrically connected with the first conductivity type pick-up region 203, the source region 169s of the NMOS transistor and the ground line of FIG. 1, and the second interconnection 177a is electrically connected with the second conductivity type pick-up region 201, the first gate electrode 165p, the second gate electrode 165n and the input pad 50 of FIG. 1. Further, the third interconnection 177b is electrically connected with the p-type drain region 171d and the n-type drain region 169d, and the fourth interconnection 177p is electrically connected with the p-type source region 171s and the power line not shown.

According to the present invention as described above, a PN diode used as an ESD circuit is formed at a single crystalline semiconductor epitaxial layer or at a single crystalline supporting substrate without crystalline defects. Thus, it is possible to realize a high performance ESD diode having a superior leakage current characteristic. Consequently, it is possible to improve an ESD characteristic of a SOI integrated circuit.

Preferred embodiments of the present invention have been disclosed herein and, although specific terms are employed, they are used and are to be interpreted in a generic and descriptive sense only and not for purpose of limitation.

Accordingly, it will be understood by those of ordinary skill in the art that various changes in form and details may be made without departing from the spirit and scope of the invention as set forth in the following claims.

What is claimed is:

1. A method of fabricating a SOI substrate, comprising:
   sequentially forming a first semiconductor layer, a second semiconductor layer and a buried oxide layer on a front surface of a semiconductor substrate;
   forming a buffer oxide layer on a front surface of a supporting substrate;
   forming an etch stopping layer on the buffer oxide layer;
   contacting the etch stopping layer with the buried oxide layer to bond the semiconductor substrate to the supporting substrate; and
   selectively removing the semiconductor substrate and the first semiconductor layer to expose the second semiconductor layer.

2. A method of fabricating a SOI substrate, comprising:
   sequentially forming a first semiconductor layer, which is a porous semiconductor epitaxial layer, a second semiconductor layer and a buried oxide layer on a front surface of a semiconductor substrate;
   forming an etch stopping layer on a front surface of a supporting substrate;
   contacting the etch stopping layer with the buried oxide layer to bond the semiconductor substrate to the supporting substrate; and
   selectively removing the semiconductor substrate and the first semiconductor layer to expose the second semiconductor layer.

3. A method of fabricating a SOI substrate, comprising:
   sequentially forming a first semiconductor layer, a second semiconductor layer and a buried oxide layer on a front surface of a semiconductor substrate;
   forming an etch stopping layer, which is formed of a silicon nitride layer on a front surface of a supporting substrate;
   contacting the etch stopping layer with the buried oxide layer to bond the semiconductor substrate to the supporting substrate; and
   selectively removing the semiconductor substrate and the first semiconductor layer to expose the second semiconductor layer.

4. A method of fabricating a SOI substrate, comprising:
   sequentially forming a first semiconductor layer, which is a bubble layer, a second semiconductor layer and a buried oxide layer on a front surface of a semiconductor substrate;
   forming an etch stopping layer on a front surface of a supporting substrate;
   contacting the etch stopping layer with the buried oxide layer to bond the semiconductor substrate to the supporting substrate; and
   selectively removing the semiconductor substrate and the first semiconductor layer to expose the second semiconductor layer.

5. A method of fabricating a SOI integrated circuit, comprising:
   preparing a SOI substrate having a first conductivity type supporting substrate, an etch stopping layer stacked on the supporting substrate, a buried oxide layer stacked on the etch stopping layer, and a semiconductor layer stacked on the buried oxide layer;

forming a device isolation layer at a predetermined region of the semiconductor layer to define first and second active regions; continuously dry-etching the device isolation layer and the buried oxide layer to form first and second preliminary holes exposing the etch stopping layer;

wet-etching the etch stopping layer exposed by the first and second preliminary holes to form first and second holes exposing the supporting substrate;

growing first and second semiconductor epitaxial layers in the first and second holes, respectively;

forming first and second conductivity type pick-up regions at the surfaces of the first and second semiconductor epitaxial layers, respectively; and forming NMOS and PMOS transistors at the first and second active regions, respectively.

6. The method as claimed in claim 5, wherein the first and second conductivity types are p-type and n-type, respectively.

7. The method as claimed in claim 6, wherein the first conductivity type pick-up region is simultaneously fanned with source/drain regions of the PMOS transistor, and the second conductivity type pick-up region is simultaneously formed with source/drain regions of the NMOS transistor.

8. The method as claimed in claim 5, wherein the first and second conductivity types are n-type and p-type, respectively.

9. The method as claimed in claim 8, wherein the first conductivity type pick-up region is simultaneously formed with source/drain regions of the NMOS transistor, and the second conductivity type pick-up region is simultaneously formed with source/drain regions of the PMOS transistor.

10. The method as claimed in claim 5, wherein the etch stopping layer is fanned of a material layer having an etch selectivity with respect to the buried oxide layer and the device isolation layer.

11. The method as claimed in claim 10, wherein the etch stopping layer is formed of a silicon nitride layer.

12. The method as claimed in claim 5, further comprising forming a buffer oxide layer between the supporting substrate and the etch stopping layer, wherein the first and second holes are formed by continuously wet-etching the etch stopping layer and the buffer oxide layer.

13. The method as claimed in claim 5, further comprising selectively forming a metal suicide layer on the pick-up regions, a gate electrode and source/drain regions of the NMOS transistors, and a gate electrode and source/drain regions of the PMOS transistors.

14. The method as claimed in claim 6, further comprising:
forming an interlayer insulation layer on the entire surface of the resultant structure where the NMOS and PMOS transistors are formed; and
forming a first interconnection electrically connected with the first conductivity type pick-up region and a second interconnection electrically connected with the second conductivity type pick-up region on the interlayer insulation layer.

15. The method as claimed in claim 14, further comprising forming an input pad connected with the second interconnection on the interlayer insulation layer, wherein the second interconnection is electrically connected with the gate electrodes of the NMOS and PMOS transistors.

16. A method of fabricating a SOI integrated circuit, comprising:
preparing a SOI substrate having a first conductivity type supporting substrate, an etch stopping layer stacked on the supporting substrate, a buried oxide layer stacked on the etch stopping layer, and a semiconductor layer stacked on the buried oxide layer;

forming a device isolation layer at a predetermined region of the semiconductor layer to define first and second active regions;

continuously dry-etching the device isolation layer and the buried oxide layer to form first and second preliminary holes exposing the etch stopping layer;

forming a first conductivity type pick-up region at the supporting substrate below the etch stopping layer exposed by the first preliminary hole;

forming a second conductivity type pick-up region at the supporting substrate below the etch stopping layer exposed by the second preliminary hole; and forming NMOS and PMOS transistors at the first and second active regions, respectively.

17. The method as claimed in claim 16, wherein the first and second conductivity types are p-type and n-type, respectively.

18. The method as claimed in claim 16, wherein the first and second conductivity types are n-type and p-type, respectively.

19. The method as claimed in claim 16, wherein the etch stopping layer is formed of a material layer having an etch selectivity with respect to the buried oxide layer and the device isolation layer.

20. The method as claimed in claim 19, wherein the etch stopping layer is formed of a silicon nitride layer.

21. The method as claimed in claim 16, further comprising forming a buffer oxide layer between the supporting substrate and the etch stopping layer.

22. The method as claimed in claim 16, further comprising selectively forming a metal suicide layer on the first conductivity type pick-up region, the second conductivity type pick-up region, a gate electrode and source/drain regions of the NMOS transistors, and a gate electrode and source/drain regions of the PMOS transistors.

23. The method as claimed in claim 17, further comprising:
forming an interlayer insulation layer on the entire surface of the resultant structure where the NMOS and PMOS transistors are formed; and
forming a first interconnection electrically connected with the first conductivity type pick-up region and a second interconnection electrically connected with the second conductivity type pick-up region on the interlayer insulation layer.

24. The method as claimed in claim 23, further comprising forming an input pad connected with the second interconnection on the interlayer insulation layer, wherein the second interconnection is electrically connected with the gate electrodes of the NMOS and PMOS transistors.

* * * * *